United States Patent
Dünkel et al.

(10) Patent No.: US 12,336,230 B1
(45) Date of Patent: Jun. 17, 2025

(54) IC STRUCTURE WITH MFMIS MEMORY CELL AND CMOS TRANSISTOR

(71) Applicant: GlobalFoundries U.S. Inc., Malta, NY (US)

(72) Inventors: Stefan Dünkel, Dresden (DE); Dominik Martin Kleimaier, Dresden (DE); Halid Mulaosmanovic, Dresden (DE); Johannes Müller, Dresden (DE); Sven Beyer, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/802,233

(22) Filed: Aug. 13, 2024

(51) Int. Cl.
*H10D 30/69* (2025.01)
*H01L 21/762* (2006.01)
*H10B 51/30* (2023.01)
*H10B 51/40* (2023.01)
*H10D 64/66* (2025.01)

(52) U.S. Cl.
CPC ..... *H10D 30/701* (2025.01); *H01L 21/76224* (2013.01); *H10B 51/30* (2023.02); *H10B 51/40* (2023.02); *H10D 64/661* (2025.01)

(58) Field of Classification Search
None
See application file for complete search history.

(56) References Cited

U.S. PATENT DOCUMENTS

| | | | |
|---|---|---|---|
| 9,564,521 B2 | 2/2017 | Schloesser et al. | |
| 11,171,157 B1 | 11/2021 | Lai et al. | |
| 2019/0067297 A1* | 2/2019 | Mueller | H01L 29/516 |
| 2019/0207009 A1* | 7/2019 | Yamaguchi | H01L 21/823462 |

FOREIGN PATENT DOCUMENTS

| | | |
|---|---|---|
| CN | 115863391 A | 3/2023 |
| WO | 2008/126961 A1 | 10/2008 |

OTHER PUBLICATIONS

Ali et al., "Impact of Stack Structure Control and Ferroelectric Material Optimization in Novel Laminate HSO and HZO MFMIS FeFET," 2022 International Symposium on VLSI Technology, Systems and Applications (VLSI-TSA), 978-1-6654-0923, 2022 IEEE, 2 pages.

Mulaosmanovic et al., "Ferroelectric field-effect transistors based on HfO2: a review," Nanotechnology, 32:502002, 2021, 28 pages.

* cited by examiner

*Primary Examiner* — Feifei Yeung Lopez
(74) *Attorney, Agent, or Firm* — Yee Tze Lim; Hoffman Warnick LLC

(57) ABSTRACT

An IC structure includes an MFMIS memory cell on a semiconductor substrate, and a CMOS transistor adjacent the MFMIS memory cell on the same semiconductor substrate. A method provides co-integration of the MFMIS memory cell with the CMOS transistor. The method may optionally co-integrate an MFIS memory cell. The IC structure and method provide a lower cost approach to forming MFMIS memory cells, which provide a number of advantages over MFIS memory cells.

20 Claims, 5 Drawing Sheets

IC STRUCTURE WITH MFMIS MEMORY CELL AND CMOS TRANSISTOR

BACKGROUND

The present disclosure relates to integrated circuit (IC) structures and, more particularly, to an IC structure including a metal-ferroelectric-metal-insulator-semiconductor (MFMIS) memory cell and a complementary metal-oxide semiconductor (CMOS) transistor on a semiconductor substrate.

Ferroelectric field effect transistors (FeFETs) include a ferroelectric material instead of a high dielectric constant (high-K) layer in a gate stack. The polarization of the ferroelectric material is retained and can be controlled by the electric field applied between the gate and the channel, making FeFETs desirable as single transistor non-volatile memory cells. The FeFET memory cells may include a metal-ferroelectric-insulator-semiconductor gate stack (forming an MFIS memory cell) with the semiconductor part being part of the semiconductor substrate. MFIS memory cells can be advantageously integrated with complementary metal-oxide semiconductor (CMOS) transistors. The use of an additional metal layer between the ferroelectric layer and the insulator layer (forming an MFMIS memory cell) is also highly desirable, for example, to eliminate the variability between the insulator layer and the ferroelectric layer during fabrication, increase reliability and increase the memory window of the device through area-ratio tuning. However, MFMIS memory cells present challenges in integration with CMOS transistors.

SUMMARY

All aspects, examples and features mentioned below can be combined in any technically possible way.

An aspect of the disclosure provides an integrated circuit (IC) structure, comprising: a metal-ferroelectric-metal-insulator-semiconductor (MFMIS) memory cell on a semiconductor substrate; and a complementary metal-oxide semiconductor (CMOS) transistor adjacent the MFMIS memory cell on the semiconductor substrate.

An aspect of the disclosure provides an integrated circuit (IC) structure, comprising: a metal-ferroelectric-metal-insulator-semiconductor (MFMIS) memory cell, the MFMIS memory cell including an upper metal layer over a ferroelectric layer over a lower metal layer over an insulator layer over a semiconductor substrate, wherein the lower metal layer includes an electrode area extending laterally from under the upper metal layer and the ferroelectric layer; a complementary metal-oxide semiconductor (CMOS) transistor adjacent the MFMIS memory cell and at least partially in the semiconductor substrate, the CMOS transistor including a metal gate over a gate insulator layer over the semiconductor substrate; a trench isolation separating the MFMIS memory cell and the CMOS transistor; a first polysilicon electrode on the upper metal layer of the MFMIS memory cell; a second polysilicon electrode on the electrode area of the lower metal layer of the MFMIS memory cell; and a third polysilicon electrode on the metal gate of the CMOS transistor.

An aspect of the disclosure provides a method, comprising: forming a first trench isolation in a semiconductor substrate, the first trench isolation defining a first memory cell region and a transistor region; forming a first metal layer over an insulator layer over the semiconductor substrate in the first memory cell region and the transistor region; forming a ferroelectric layer over the insulator layer and a second metal layer over the ferroelectric layer in the first memory cell region, wherein an electrode area of the first metal layer extends laterally from under the second metal layer and the ferroelectric layer; forming a polysilicon layer to form, in the first memory cell region, a first polysilicon electrode on the electrode area of the first metal layer and a second polysilicon electrode on the second metal layer and, in the transistor region, a third polysilicon electrode on the first metal layer; and forming an interlayer dielectric between the first memory cell region and the transistor region.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
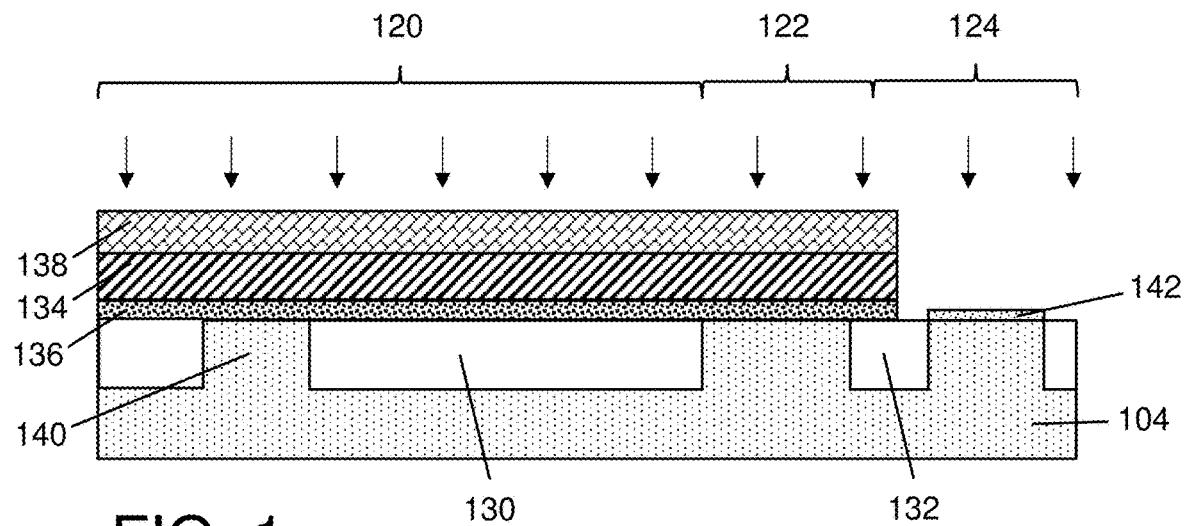
FIG. 1 shows a cross-sectional view of initial steps of a method including forming an insulator layer and a first, upper metal layer, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include an integrated circuit (IC) structure and a related method. The IC structure includes a metal-ferroelectric-metal-insulator-semiconductor (MFMIS) memory cell on a semiconductor substrate, and a complementary metal-oxide semiconductor (CMOS) transistor adjacent the MFMIS memory cell on the same semiconductor substrate. The method provides co-integration of an MFMIS memory cell with a CMOS transistor as part of a high-dielectric constant metal gate (HKMG) process, which lowers costs compared to separate formation of the MFMIS memory cell. The process may optionally co-integrate a metal-ferroelectric-insulator-semiconductor (MFIS) memory cell.

The IC structure and method provide a lower cost approach to forming MFMIS memory cells, which provide a number of advantages over MFIS memory cells. For example, the extra metal layer eliminates the variability in grain orientation exhibited by the interface of the insulator layer and the ferroelectric layer in MFIS memory cells by providing another metal layer. MFMIS memory cells also allow decoupling of the program/erase and read paths by providing two electrodes, one to each metal layer, rather than one electrode as in MFIS memory cells. MFMIS memory cells also have more endurance, e.g., capable of perhaps 10,000 times more cycles, than MFIS memory cells. As understood in the art, a memory window of FeFET memory cells is the separation between the low-state threshold voltage and the high-state threshold voltage and is an important indicator of FeFET memory cell operational characteristics. In MFMIS memory cells according to embodiments of the disclosure, the memory window can be tuned by controlling a ratio of the area between the ferroelectric layer and the first lower metal layer versus the area between the insulator layer and the semiconductor substrate that provides the read path.

Figure 5A:
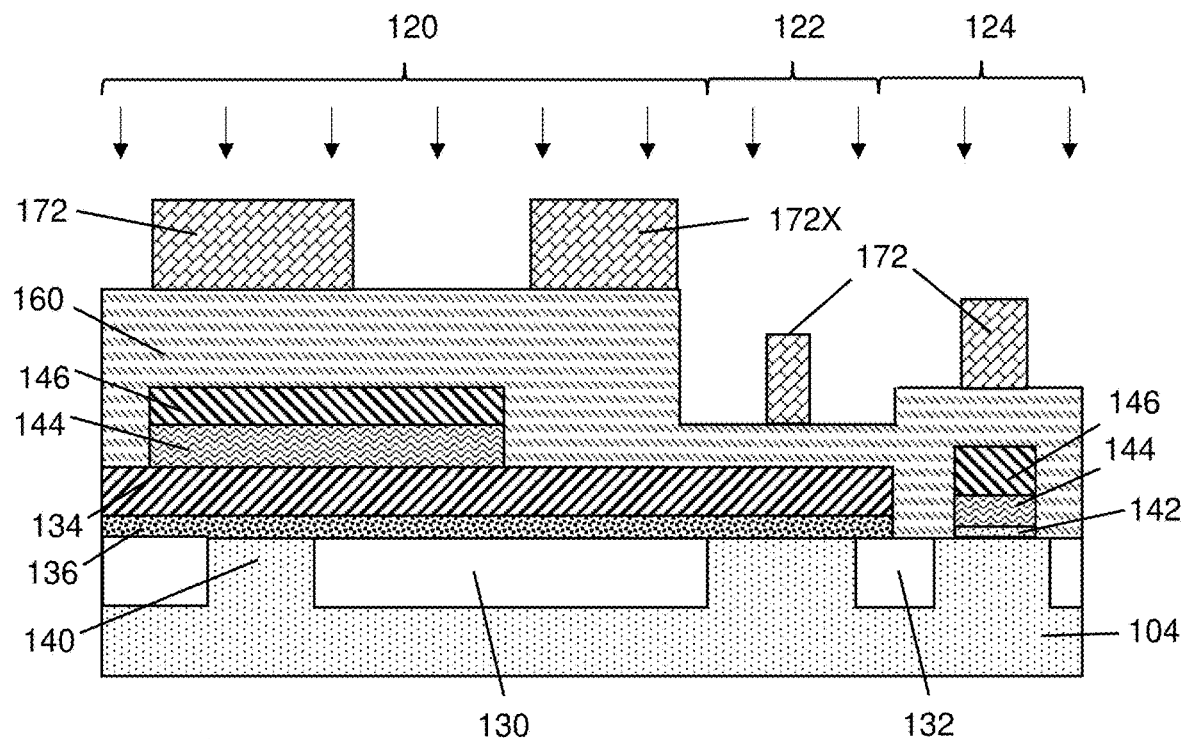
FIGS. 5A-B show cross-sectional views of patterning the polysilicon layer, according to two different embodiments of the disclosure.
Figure 5B:
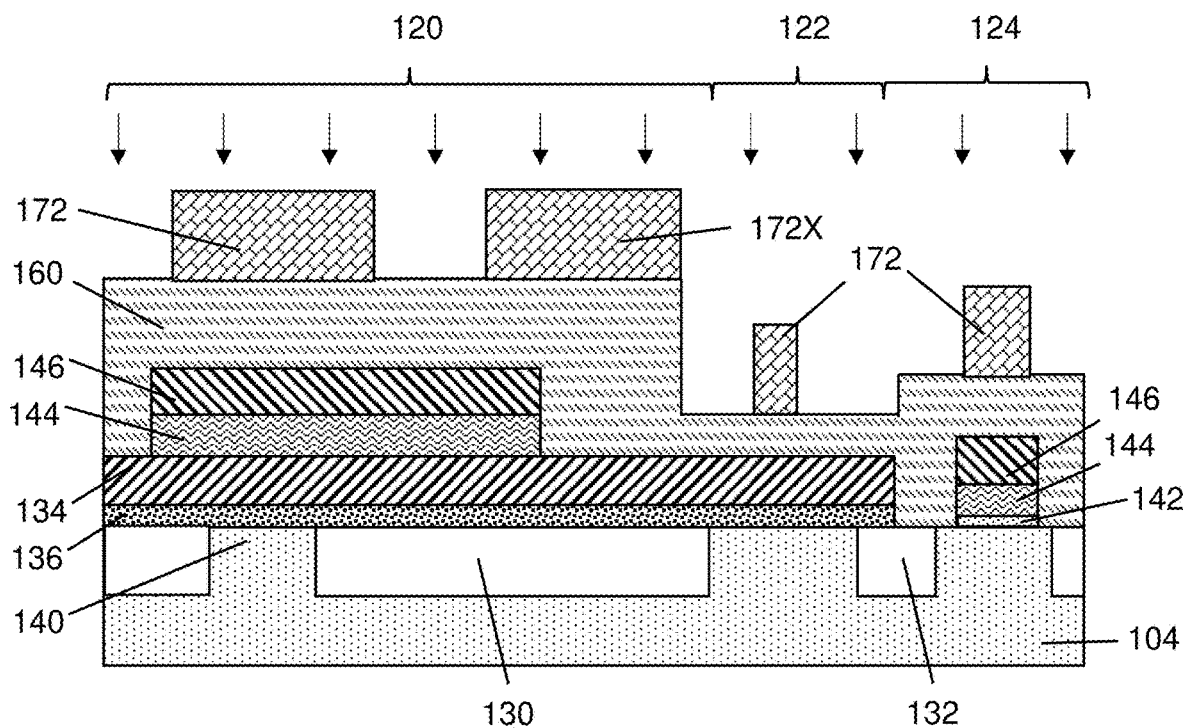
Figure 6A:
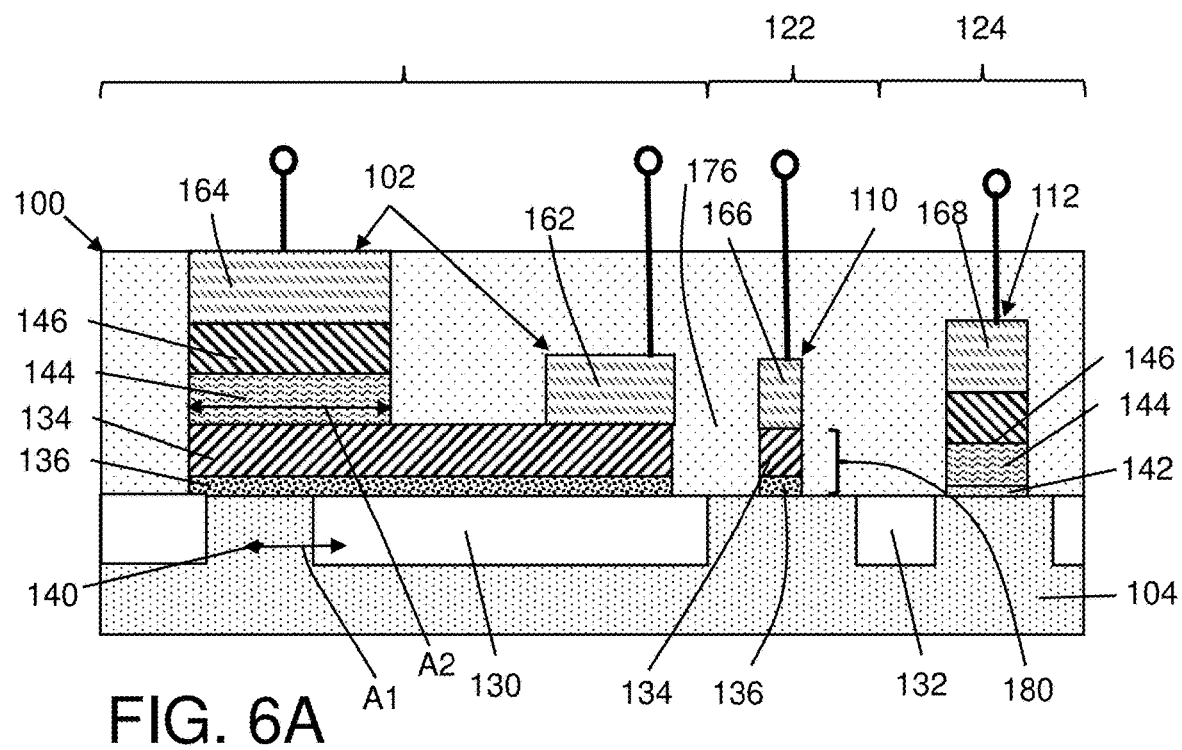
FIGS. 6A-B show cross-sectional views of an IC structure including an MFMIS memory cell and a CMOS transistor, according to two different embodiments of the disclosure.
Figure 6B:
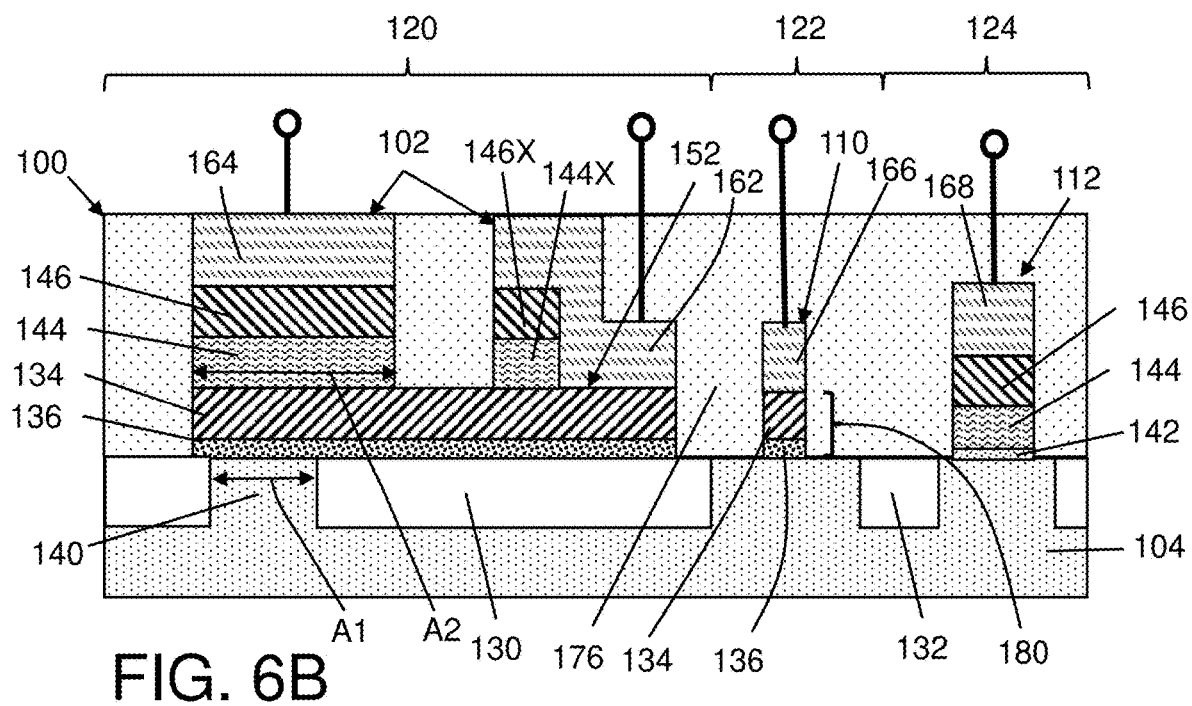

FIGS. 1-6B show cross-sectional views of a method of forming an IC structure 100 (FIGS. 6A-B) according to embodiments of the disclosure. As will be described and as shown in FIGS. 6A-B, the method allows fabrication of IC structure 100 with a co-integration of an MFMIS memory cell 102 (e.g., an MFMIS FeFET) on a semiconductor substrate 104, and a CMOS transistor 110 adjacent MFMIS memory cell 102 on semiconductor substrate 104. Optionally, an MFIS memory cell 112 (e.g., an MFIS FeFET) may also be fabricated during the same method. As will be described, the method allows fabrication of MFMIS memory cell 102 with CMOS transistor 110 using modifications to CMOS processing used for fabricating CMOS transistor 110, such as but not limited to high-dielectric constant metal gate (HKMG) processing. In this manner, MFMIS memory cell 102, CMOS transistor 110 and optional MFIS memory cell 112 may share semiconductor substrate 104.

FIG. 1 shows a cross-sectional view of fabrication of IC structure 100 (FIGS. 6A-B) after a number of initial steps. IC structure 100 (FIGS. 6A-B) may be segmented into a first memory cell region 120, a transistor region 122 and an optional second memory cell region 124 by trench isolations 130, 132. Processing described herein occurring in second memory cell region 124 is optional, i.e., MFIS memory cell 112 (FIGS. 6A-B) may be omitted from IC structure 100 (FIGS. 6A-B). More particularly, FIG. 1 shows forming a first trench isolation 130 in semiconductor substrate 104. First trench isolation 130 electrically isolates and defines first memory cell region 120 from transistor region 122. FIG. 1 also shows optionally forming a second trench isolation 132 in semiconductor substrate 104. Second trench isolation 132 electrically isolates and defines transistor region 122 from second memory cell region 124 adjacent at least one of first memory cell region 120 and transistor region 122 (shown). Trench isolations (TIs) 130, 132 include a trench etched into semiconductor substrate 104 and filled with an insulating material such as oxide, to isolate one region of the substrate from an adjacent region of the substrate. The etching may include patterning a mask (not shown) and etching semiconductor substrate 104, e.g., using a reactive ion etch (RIE), and then removing the mask. As the trench formation process is known, no further details are provided so the reader can focus on the salient aspects of the disclosure. First trench isolation 130 may be formed such that a portion 140 of semiconductor substrate 104 extends through first trench isolation 130 to contact subsequently formed insulator layer 136 in first memory cell region 120.

One or more devices (e.g., memory cells 102, 112 and CMOS transistor 110 (FIGS. 6A-B)) may be disposed within a region isolated by trench isolations. Each trench isolation 130, 132 may be formed of any currently-known or later developed substance for providing electrical insulation, and as examples may include: silicon nitride, silicon oxide, fluorinated silicon oxide, hydrogenated silicon oxycarbide, porous hydrogenated silicon oxycarbide, boro-phospho-silicate glass, silsesquioxanes, carbon doped oxides (i.e., organosilicates) that include atoms of silicon, carbon, oxygen, and/or hydrogen, thermosetting polyarylene ethers, a spin-on silicon-carbon containing polymer material, near frictionless carbon (NFC), or layers thereof. Trench isolations 130, 132 may be provided as a shallow trench isolation (STI) or a deep trench isolation (DTI). Other trench isolations may also be provided to isolate regions 120, 122, 124 from other parts of IC structure 100 (FIGS. 6A-B).

FIG. 1 also shows forming a first, lower metal layer 134 over an insulator layer 136 over semiconductor substrate 104 in first memory cell region 120 and transistor region 122. Insulator layer 136 may be formed by any appropriate deposition technique. Example deposition techniques include but are not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Here, any form of CVD may be used. Insulator layer 136 may include any now known or later developed dielectric material used for MFMIS and/or gate dielectrics for CMOS transistors. For example, insulator layer 136 may include but is not limited to: hafnium silicate, hafnium oxide, zirconium silicate, zirconium oxide, silicon oxide, silicon nitride, silicon oxynitride, high-k material, or any combination of these materials.

First, lower metal layer 134 (hereafter "lower metal layer 134") may be deposited by any appropriate deposition technique, e.g., CVD. Lower metal layer 134 may include any metal or metal alloy used for metal layer(s) of MFMIS or MFIS memory cells and/or CMOS transistor gate conductors, such as but not limited to: tantalum, tantalum nitride, tantalum carbide, titanium, titanium nitride, titanium carbide, titanium aluminum carbide, titanium aluminum, tungsten, tungsten nitride, tungsten carbide, or a combination thereof.

Where MFIS memory cell 112 (FIGS. 6A-B) is to be formed in second memory cell region 124, as shown FIG. 1, the method may also include removing lower metal layer 134 and insulator layer 136 from over second memory cell region 124. This process may include patterning a mask 138 and etching (arrows) to remove lower metal layer 134 and insulator layer 136. Mask 138 may include any appropriate mask material such as a silicon nitride hard mask or a soft resist-based mask, and the etching may include any appropriate chemistry for the layer(s) being removed, e.g., a RIE. Where MFIS memory cell 112 is not provided, this step may be omitted. Once etching is complete, mask 138 may be removed. Any masks described herein may be removed using any known removal process appropriate for the mask material, e.g., a wet etch for hard nitride mask or an ashing process (oxygen dry strip process) for a soft resist-based mask. FIG. 1 also shows an insulator layer 142, e.g., of silicon oxide, formed on semiconductor substrate 104 in second memory cell region 124. Insulator layer 142 may form naturally from exposure of semiconductor substrate 104 to oxygen.

Figure 2:
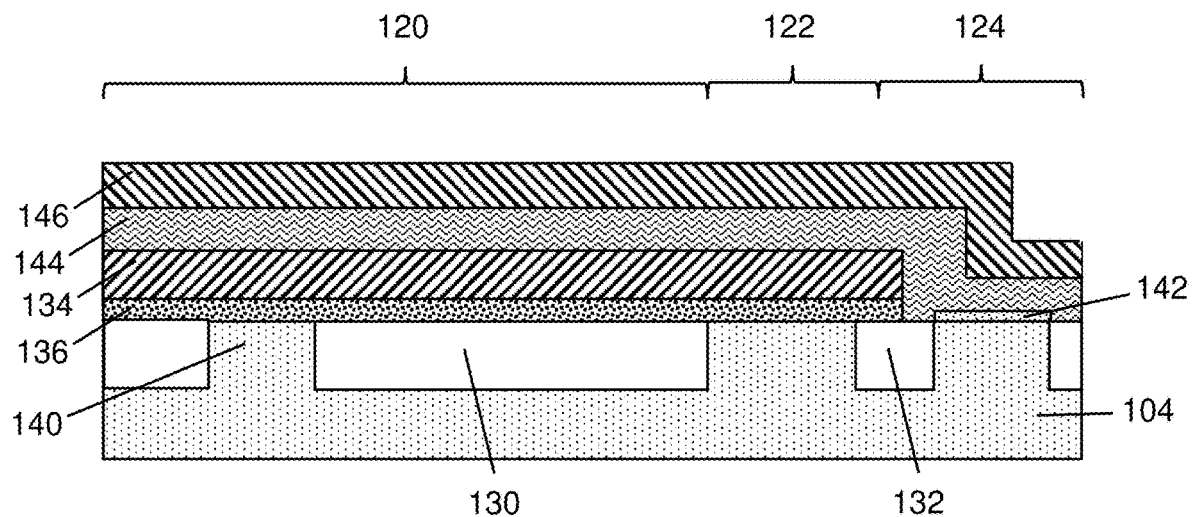
FIG. 2 shows a cross-sectional view of forming a ferroelectric layer and a second, upper metal layer, according to embodiments of the disclosure.
Figure 3:
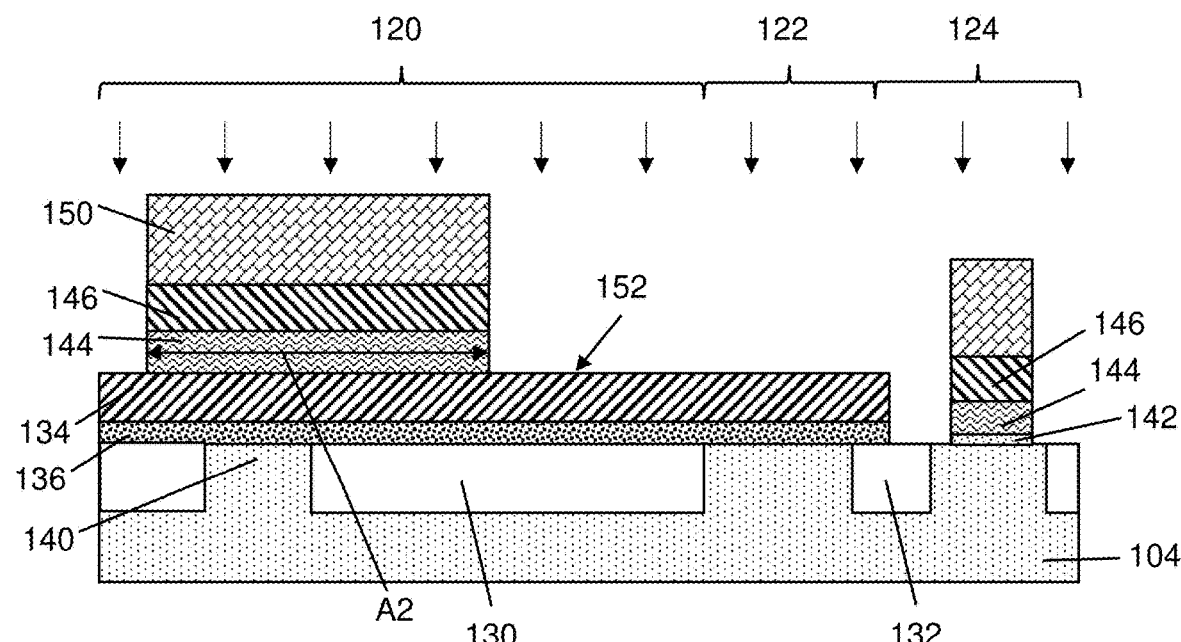
FIG. 3 shows a cross-sectional view of patterning the ferroelectric layer and the second, upper metal layer, according to embodiments of the disclosure.

FIGS. 2-3 show forming a ferroelectric layer 144 over insulator layer 136 and a second, upper metal layer 146 over ferroelectric layer 144 in first memory cell region 120. As also shown in FIGS. 2-3, where MFIS memory cell 112 (FIGS. 6A-B) is to be included, ferroelectric layer 144 and second, upper metal layer 146 (hereafter "upper metal layer 146") are also formed over second memory cell region 124, i.e., over insulator layer 142 therein. That is, forming ferroelectric layer 144 includes forming it over insulator layer 142 in second memory cell region 124 and forming upper metal layer 146 includes forming it over ferroelectric layer 144 in second memory cell region 124. Each layer 144, 146 may be deposited using any appropriate deposition technique over all regions 120, 122, 124. Ferroelectric layer 144 may include any dielectric that remembers the electric field to which it has been exposed. Ferroelectric layer 144 may include but is not limited to: aluminum scandium nitride, hafnium dioxide, hafnium-zirconium oxide, bismuth titanate, polyvinylidene fluoride, lead zirconate titanates (PZT) (e.g., $Pb(Zr_xTi_{1-x})O_3$), $Pb_{1-x}Ln_xTiO_3$ (PLT) and related mixed zirconate/titanates (PLZT). Ferroelectric layer 144 is not the same dielectric material as insulator layers 136, 142. Upper metal layer 146 may include any of the materials listed herein for lower metal layer 134 and may be the same or a different material as lower metal layer 134.

FIG. 3 shows patterning ferroelectric layer 144 and upper metal layer 146. The patterning may include forming a mask 150 and using any appropriate etching chemistry or chemistries for the materials to be removed. As shown, mask 150 exposes transistor region 122 such that the etching (arrows) removes ferroelectric layer 144 and upper metal layer 146 over transistor region 122, leaving lower metal layer 134 over insulator layer 136 therein. Further, the etching exposes an electrode area 152 of lower metal layer 134 extending laterally from under upper metal layer 146 and ferroelectric layer 144, i.e., in first memory cell region 120. Once etching is complete, mask 150 may be removed using any appropriate mask removal process.

FIGS. 4-6B show forming a polysilicon layer 160 to form, in first memory cell region 120, a first polysilicon electrode 162 (FIGS. 6A-B) on electrode area 152 of lower metal layer 134 and a second polysilicon electrode 164 (FIGS. 6A-B) on upper metal layer 146 and, in transistor region 122, a third polysilicon electrode 166 (FIGS. 6A-B) on lower metal layer 134. Where MFIS memory cell 112 is used, a fourth polysilicon electrode 168 (FIGS. 6A-B) is also formed on upper metal layer 146 in second memory cell region 124 may also be formed.

Figure 4:
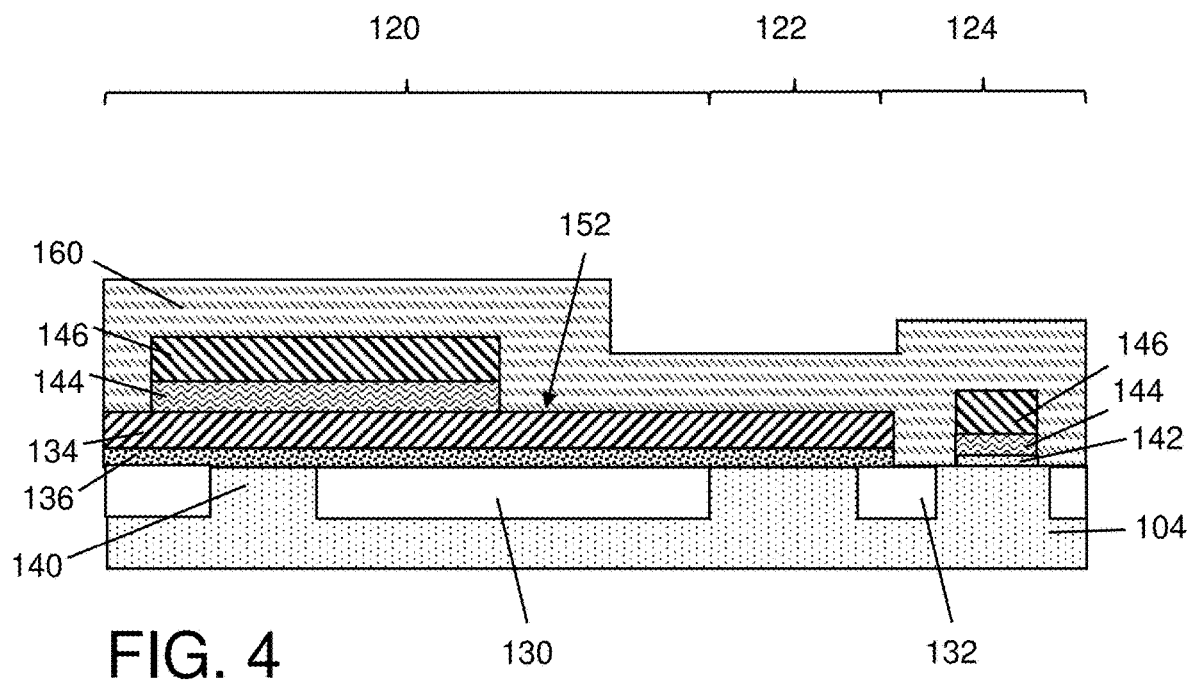
FIG. 4 shows a cross-sectional view of forming a polysilicon layer, according to embodiments of the disclosure.

With more particularity, FIG. 4 shows a cross-sectional view of forming polysilicon layer 160. Polysilicon layer 160 may be deposited using any appropriate deposition technique, e.g., CVD, and may be doped or undoped.

FIGS. 5A and 5B show cross-sectional views of patterning a mask 172 for removing polysilicon layer 160, where desired, using an appropriate etching chemistry, e.g., a RIE (arrows), to form electrodes 162, 164, 166, 168. FIG. 5A shows one pattern and FIG. 5B shows a slightly different pattern for mask 172. More specifically, in FIG. 5B, mask portion 172X is wider than in FIG. 5A, which results, as shown in FIG. 6B, portions of ferroelectric layer 144X and upper metal layer 146X remaining under first polysilicon electrode 162 over electrode area 152 of lower metal layer 134. The portions of ferroelectric layer 144X and upper metal layer 146X are inactive (dummy) in this setting as they are electrically separated from other structure. The width of portions of ferroelectric layer 144X and upper metal layer 146X may also be determined, in part, by a width of mask 150 in FIG. 3 used to pattern layers 144, 146. In contrast, as shown in FIG. 6A, where a narrower mask portion 172X of FIG. 5A is used, first polysilicon electrode 162 is in direct contact along its entire width with lower metal layer 134 with no remaining portions of ferroelectric layer 144 or upper metal layer 146. Once complete, mask 172 can be removed using any appropriate technique.

Although not shown in the drawings, it will be recognized that at this stage processing may be carried out to form doped regions in semiconductor substrate 104, e.g., for source/drain regions of MFMIS memory cell 102 (i.e., MFMIS FeFET), for source/drain regions for CMOS transistor 110 (FIGS. 6A-B) and, if provided, MFIS memory cell 112 (i.e., MFIS FeFET). Although not shown for clarity, it will be recognized the doping processing may be preceded by spacer formation for any of the gates (polysilicon electrodes) in a known fashion, e.g., deposition of spacer material such as silicon nitride and etching to shape the sidewall spacers. The doping processes may include, for example, ion implantation or in-situ doping of semiconductor material. As these processes are well known, no further details are provided so the reader can focus on the salient aspects of the disclosure.

As shown FIGS. 6A-B, where polysilicon layer 160 is removed, an interlayer dielectric(s) 176 is/are formed to electrically separate MFMIS memory cell 102, transistor 110, and where provided, MFIS memory cell 112. More specifically, FIGS. 6A-B show forming interlayer dielectric(s) 176 between first memory cell region 120 and transistor region 122. Interlayer dielectric(s) 176 may include any now known or later developed interlayer dielectric (ILD) material(s) such as but not limited to silicon dioxide materials; fluorinated silicate glass; organic polymeric thermoset materials; silicon oxycarbide; fluorine doped silicon oxide; spin-on glasses; silsesquioxanes, including hydrogen silsesquioxane, methyl silsesquioxane and mixtures or copolymers thereof; benzocyclobutene-based polymer dielectrics, and any silicon-containing low-k dielectric. Forming interlayer dielectric(s) 176 further includes forming it between first polysilicon electrode 162 on electrode area 152 of lower metal layer 134 and second polysilicon electrode 164 on upper metal layer 146. Where MFIS memory cell 112 is provided, forming interlayer dielectric(s) 176 further includes forming it between second memory cell region 124 and at least one of first memory cell region 120 and transistor region 122 (shown) to isolate MFIS memory cell 112 from MFMIS memory cell 102 or CMOS transistor 110.

Figure 7:
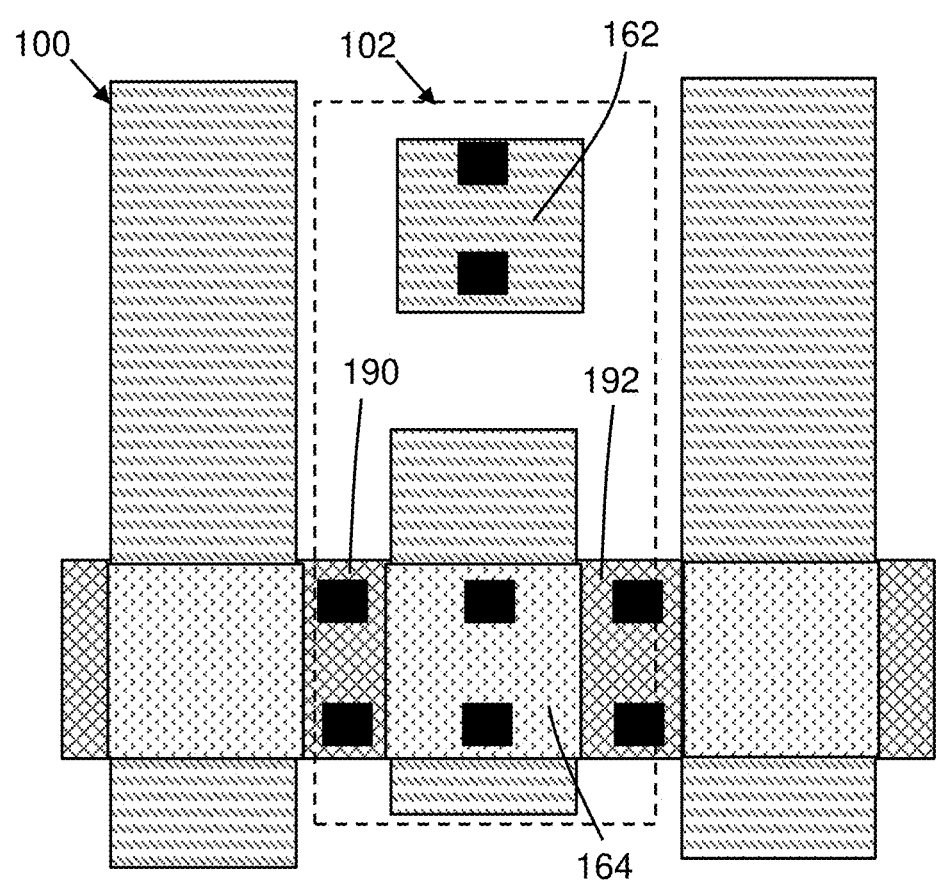
FIG. 7 shows a top-down view of an IC structure including an MFMIS memory cell, according to embodiments of the disclosure.

It will be recognized that contacts (some shown schematically by thick lines in FIGS. 6A-B) to polysilicon electrodes 162, 164, 166, 168 may be made using any now known or later developed processing (not shown), e.g., etching contact openings, and depositing conductors such as a refractory metal liner and conductor, and planarizing. FIG. 7 shows a top-down view of MFMIS memory cell 102 showing contacts (black boxes) thereto. Contacts not shown in FIGS. 6A-B may be made to source/drain regions 190, 192 of MFMIS memory cell 102, source/drain regions of CMOS transistor 110, and, if applicable, to source/drain regions of MFIS memory cell 112. Referring to FIGS. 6A-B and 7, it will be recognized MFMIS memory cell 102 is a four (4) terminal MFMIS FeFET including: a bottom gate via first polysilicon electrode 162; a top gate via second polysilicon electrode 164; a source region 190 in substrate 104 on one side (into or out of page of FIGS. 6A-B); and a drain region 192 in substrate 104 on the other side (the other direction of into or out of page of FIGS. 6A-B. In addition, other back-end-of-line interconnect processing that may be carried out for interconnections to the devices generated according to the disclosure are not shown, e.g., additional scaling via and metal layers.

FIG. 6A shows a cross-sectional view of IC structure 100 according to embodiments of the disclosure, and FIG. 6B shows a cross-sectional view of IC structure 100 according to other embodiments of the disclosure. As shown in FIGS. 6A-B, IC structure 100 includes metal-ferroelectric-metal-insulator-semiconductor (MFMIS) memory cell 102 on a semiconductor substrate 104, and complementary metal-oxide semiconductor (CMOS) transistor 110 adjacent MFMIS memory cell 102 on semiconductor substrate 104. MFMIS memory cell 102 is in first memory cell region 120, and CMOS transistor 110 is in transistor region 122. IC structure 100 may also optionally include metal-ferroelectric-insulator-semiconductor (MFIS) memory cell 112 adjacent at least one of MFMIS memory cell 102 and CMOS transistor 110 (latter shown). MFMIS memory cell 102 shares semiconductor substrate 104 with CMOS transistor 110 and, as has been described herein, can be fabricated together using modifications to CMOS processing used for CMOS transistor 110, such as but not limited to high-dielectric constant metal gate (HKMG) processing. MFIS memory cell 112 also shares semiconductor substrate 104 with MFMIS memory cell 102 and CMOS transistor 110 can be fabricated with the other structure using modifications to CMOS processing used for CMOS transistor 110.

MFMIS memory cell 102 includes second, upper metal layer 146 over ferroelectric layer 144 over first, lower metal layer 134 over insulator layer 136 over semiconductor substrate 104. Lower metal layer 134 is lower in MFMIS memory cell 102 than upper metal layer 146. Hence, MFMIS memory cell 102 may also be stated to include ferroelectric layer 144 over lower metal layer 134 and upper metal layer 146 over ferroelectric layer 144. As noted, lower metal layer 134 includes electrode area 152 extending laterally from under upper metal layer 146 and ferroelectric layer 144.

In contrast to typical MFMIS memory cells, MFMIS memory cell 102 includes a first polysilicon electrode 162 to lower metal layer 134 and a second polysilicon electrode 164 to upper metal layer 146, which separates the program/erase path from the read path for the memory cell. More particularly, second polysilicon electrode 164 is on upper metal layer 146 of MFMIS memory cell 102, first polysilicon electrode 162 is on electrode area 152 of lower metal layer 134 of MFMIS memory cell 102. Further, third polysilicon electrode 166 is on metal gate 180 of CMOS transistor 110. Due to the method of fabrication, as described herein, second and third polysilicon electrodes 164, 166 are portions of a same polysilicon layer. In this case, since they were sectioned from single polysilicon layer 160, they may have the same thickness.

The method of fabrication results in both MFMIS memory cell 102 and CMOS transistor 110 including insulator layer 136, now a gate insulator layer for CMOS transistor 110, that are portions of a single insulator layer over semiconductor substrate 104. Here, since they were sectioned from the same insulator layer 136, they have the same lower surface and upper surface, and have the same thickness. Similarly, both MFMIS memory cell 102 and CMOS transistor 110 include lower metal layer 134, now a metal gate over the gate insulator layer for CMOS transistor 110, that are portions of a single metal layer. Here, since they were sectioned from a single lower metal layer 134, they have the same lower surface and upper surface, and have the same thickness. For CMOS transistor 110, lower metal layer 134 and insulator layer 136 in transistor region 122 constitutes a metal gate 180 of CMOS transistor 110. Doped regions in semiconductor substrate 104 (not shown) provide source/drain regions for CMOS transistor 110. As described, portions of same insulator layer 136 and portions of lower metal layer 134 are separated by interlayer dielectric 176.

IC structure 100 also includes first trench isolation 130 separating MFMIS memory cell 102 and CMOS transistor 110. As noted, portion 140 of semiconductor substrate 104 extends through trench isolation 130 to contact insulator layer 136 of MFMIS memory cell 102. Portion 140 of semiconductor substrate 104 in first trench isolation 130 can be shaped and sized to create a desired area A1 between insulator layer 136 and portion 140. Similarly, during the patterning of ferroelectric layer 144 and upper metal layer 146 as shown in FIG. 3, an area A2 of an interface between ferroelectric layer 144 and first lower metal layer 134 can be selected. (Note, it is understood areas A1, A2 also extend into the plane of the page of the drawings despite the simplified arrow notations provided.) A ratio of area A2 to A1 can be customized or tuned to provide a larger memory window for MFMIS memory cell 102, and lower electric stress at the interface between insulator layer 136 and portion 140 of semiconductor substrate 104. More specifically, with MFMIS memory cell 102 including two electrodes 162, 164, the program electric field path and the erase electric field path are applied to two electrodes across interfaces between ferroelectric layer 144 and metal layers 134 and 146 rather than one of them passing through insulator layer 136 and a channel (portion 140) interface in semiconductor substrate 104 interface, which reduces electrical stress and improves reliability. Lower stresses also reduce reliability of the insulator-substrate interface (at portion 140).

Where MFIS memory cell 112 is provided in second memory cell region 124, it includes upper metal layer 146 over ferroelectric layer 144 over insulator layer 142 over semiconductor substrate 104. Due to the fabrication method, upper metal layers 146 of MFMIS memory cell 102 and MFIS memory 112 are from a same metal layer 146 and ferroelectric layers 144 of MFMIS memory cell 102 and MFIS memory cell 112 are from a same ferroelectric layer. Here, since they were sectioned from layers 144, 146, they have the same thickness.

Embodiments of the disclosure provide various technical and commercial advantages, examples of which are discussed herein. The method provides an MFMIS memory cell with lower costs by removal of process-steps compared to existing FeFET flows. The method also provides the option to build two memory cell structures (MFMIS and MFIS) with already existing flow at the same costs. As described herein, the MFMIS memory cell enables multi-bit (multi-level-cell) operation, i.e., 1-bit or 2-bit operation, and provides better device properties, e.g., reduced variation, improved reliability, enhanced memory window.

In the structures and method described above, a semiconductor material refers to a material whose conducting properties can be altered by doping with an impurity. Semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum, gallium, or indium, with group V elements, such as nitrogen, phosphorous, arsenic or antimony. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron or indium, to achieve P-type conductivity, whereas a silicon-based semiconductor material is typically doped with a Group V dopant, such as arsenic (As), phosphorous or antimony, to achieve N-type conductivity. A gallium nitride-based semiconductor material is typically doped with magnesium to achieve P-type conductivity and with silicon or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The structure and method as described above are used in the fabrication of integrated circuit structures and/or chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate+/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
    a metal-ferroelectric-metal-insulator-semiconductor (MFMIS) memory cell on a semiconductor substrate; and
    a complementary metal-oxide semiconductor (CMOS) transistor adjacent the MFMIS memory cell on the semiconductor substrate
    a metal-ferroelectric-insulator-semiconductor (MFIS) memory cell adjacent at least one of the MFMIS memory cell and the CMOS transistor, the MFIS memory cell sharing the semiconductor substrate with the MFMIS memory cell and the CMOS transistor.

2. The IC structure of claim 1, wherein the MFMIS memory cell includes an insulator layer and the CMOS transistor includes a gate insulator layer that are portions of a single insulator layer over the semiconductor substrate, and
    wherein the MFMIS memory cell includes a lower metal layer over the insulator layer of the MFMIS memory cell and the CMOS transistor includes a metal gate over the gate insulator layer of the CMOS transistor that are portions of a single metal layer.

3. The IC structure of claim 2, wherein the portions of the single insulator layer and the portions of the single metal layer are separated by an interlayer dielectric.

4. The IC structure of claim 2, wherein the MFMIS memory cell further includes a ferroelectric layer over the lower metal layer and an upper metal layer over the ferroelectric layer, and wherein the lower metal layer includes an electrode area extending laterally from under the upper metal layer and the ferroelectric layer.

5. The IC structure of claim 4, further comprising a first polysilicon electrode on the upper metal layer of the MFMIS memory cell, a second polysilicon electrode on the electrode area of the lower metal layer of the MFMIS memory cell, and a third polysilicon electrode on the metal gate of the CMOS transistor,
    wherein the first, second and third polysilicon electrodes are portions of a same polysilicon layer.

6. The IC structure of claim 1, further comprising a trench isolation separating the MFMIS memory cell and the CMOS transistor.

7. The IC structure of claim 6, wherein a portion of the semiconductor substrate extends through the trench isolation to contact an insulator layer of the MFMIS memory cell.

8. The IC structure of claim 1, wherein the MFMIS memory cell includes an upper metal layer over a ferroelectric layer over a lower metal layer over an insulator layer over the semiconductor substrate, and the MFIS memory cell includes an upper metal layer over a ferroelectric layer over an insulator layer over the semiconductor substrate, wherein the upper metal layers of the MFMIS memory cell and the MFIS memory are from a same metal layer and the insulator layers of the MFMIS memory cell and the MFIS memory are from a same insulator layer.

9. An integrated circuit (IC) structure, comprising:
    a metal-ferroelectric-metal-insulator-semiconductor (MFMIS) memory cell, the MFMIS memory cell including an upper metal layer over a ferroelectric layer over a lower metal layer over an insulator layer over a semiconductor substrate, wherein the lower metal layer includes an electrode area extending laterally from under the upper metal layer and the ferroelectric layer;
    a complementary metal-oxide semiconductor (CMOS) transistor adjacent the MFMIS memory cell and at least partially in the semiconductor substrate, the CMOS transistor including a metal gate over a gate insulator layer over the semiconductor substrate;
    a trench isolation separating the MFMIS memory cell and the CMOS transistor;
    a first polysilicon electrode on the upper metal layer of the MFMIS memory cell;
    a second polysilicon electrode on the electrode area of the lower metal layer of the MFMIS memory cell; and
    a third polysilicon electrode on the metal gate of the CMOS transistor.

10. The IC structure of claim 9, wherein the MFMIS memory cell and the CMOS transistor share the semiconductor substrate.

11. The IC structure of claim 9, further comprising an interlayer dielectric separating the MFMIS memory cell and the CMOS transistor.

12. The IC structure of claim 9, wherein the insulator layer of the MFMIS memory cell and the gate insulator layer of the CMOS transistor are portions of a same insulator layer over the semiconductor substrate, and the lower metal layer of the MFMIS memory cell and the metal gate of the CMOS transistor are portions of a same metal layer.

13. The IC structure of claim 9, wherein the first, second and third polysilicon electrodes are portions of a same polysilicon layer.

14. The IC structure of claim 9, further comprising a metal-ferroelectric-insulator-semiconductor (MFIS) memory cell adjacent at least one of the MFMIS memory cell and the CMOS transistor, the MFIS memory cell sharing the semiconductor substrate with the MFMIS memory cell and the CMOS transistor.

15. A method, comprising:
    forming a first trench isolation in a semiconductor substrate, the first trench isolation defining a first memory cell region and a transistor region;
    forming a first metal layer over an insulator layer over the semiconductor substrate in the first memory cell region and the transistor region;
    forming a ferroelectric layer over the insulator layer and a second metal layer over the ferroelectric layer in the first memory cell region, wherein an electrode area of the first metal layer extends laterally from under the second metal layer and the ferroelectric layer;

forming a polysilicon layer to form, in the first memory cell region, a first polysilicon electrode on the electrode area of the first metal layer and a second polysilicon electrode on the second metal layer and, in the transistor region, a third polysilicon electrode on the first metal layer; and forming an interlayer dielectric between the first memory cell region and the transistor region.

16. The method of claim 15, wherein a portion of the semiconductor substrate extends through the first trench isolation to contact the insulator layer in the first memory cell region.

17. The method of claim 15, wherein the first metal layer and the insulator layer in the transistor region constitutes a metal gate of a complementary metal-oxide semiconductor (CMOS) transistor.

18. The method of claim 15, wherein forming the interlayer dielectric further includes forming the interlayer dielectric between the first polysilicon electrode on the electrode area of the first metal layer and the second polysilicon electrode on the second metal layer.

19. The method of claim 15, further comprising:

forming a second trench isolation in the semiconductor substrate, the second trench isolation defining a second memory cell region adjacent at least one of the first memory cell region and the transistor region;

wherein forming the ferroelectric layer includes forming the ferroelectric layer over the semiconductor substrate in the second memory cell region and forming the second metal layer includes forming the second metal layer over the ferroelectric layer in the second memory cell region; and wherein forming the interlayer dielectric includes forming the interlayer dielectric between the second memory cell region and the at least one of the first memory cell region and the transistor region.

20. The IC structure of claim 12, wherein the portions of the single insulator layer and the portions of the single metal layer are separated by an interlayer dielectric.

\* \* \* \* \*